(12) United States Patent
Huang

(10) Patent No.: US 8,274,150 B2
(45) Date of Patent: Sep. 25, 2012

(54) CHIP BUMP STRUCTURE AND METHOD FOR FORMING THE SAME

(75) Inventor: Cheng Tang Huang, Hsinchu (TW)

(73) Assignee: Chipmos Technologies Inc., Hsinchu (TW)

( * ) Notice: Subject to any disclaimer, the term of this patent is extended or adjusted under 35 U.S.C. 154(b) by 0 days.

(21) Appl. No.: 13/104,597

(22) Filed: May 10, 2011

(65) Prior Publication Data
US 2011/0291273 A1 Dec. 1, 2011

(30) Foreign Application Priority Data
May 26, 2010 (TW) .................................. 99116772 A

(51) Int. Cl.
*H01L 23/48* (2006.01)

(52) U.S. Cl. ........ 257/738; 257/734; 257/737; 257/777; 257/E23.023; 257/E21.159; 438/113; 438/613; 438/614; 438/183; 438/186

(58) Field of Classification Search .................. 438/113, 438/613–614, 183, 186, 195, 570; 257/734, 257/738, 737, 777, E23.023, E21.159, E23.01
See application file for complete search history.

(56) References Cited

U.S. PATENT DOCUMENTS

| | | | | |
|---|---|---|---|---|
| 3,809,625 A | * | 5/1974 | Brown et al. .................. 205/103 |
| 4,950,623 A | * | 8/1990 | Dishon ........................... 438/614 |
| 5,034,345 A | * | 7/1991 | Shirahata ....................... 438/613 |
| 5,477,087 A | * | 12/1995 | Kawakita et al. ............. 257/737 |
| 5,707,902 A | * | 1/1998 | Chang et al. .................. 438/614 |
| 5,877,556 A | * | 3/1999 | Jeng et al. ...................... 257/737 |
| 6,316,952 B1 | * | 11/2001 | Ahmad et al. ............ 324/750.05 |
| 6,809,020 B2 | * | 10/2004 | Sakurai et al. ................. 438/613 |
| 6,905,953 B2 | * | 6/2005 | Lindgren ........................ 438/612 |
| 6,919,264 B2 | * | 7/2005 | Brintzinger et al. .......... 438/614 |
| 6,924,553 B2 | * | 8/2005 | Ohara ............................ 257/738 |
| 7,041,589 B2 | * | 5/2006 | Lay et al. ....................... 438/613 |
| 7,338,890 B2 | * | 3/2008 | Lee et al. ....................... 438/613 |
| 7,443,040 B2 | * | 10/2008 | Lo .................................. 257/780 |
| 7,468,292 B2 | * | 12/2008 | Yamano ........................ 438/113 |
| 7,741,206 B2 | * | 6/2010 | Yoo et al. ...................... 438/612 |
| 7,772,698 B2 | * | 8/2010 | Hwan et al. ................... 257/737 |
| 7,871,918 B2 | * | 1/2011 | Chang ........................... 438/613 |
| 7,893,533 B2 | * | 2/2011 | Saito ............................. 257/737 |

(Continued)

*Primary Examiner* — N Drew Richards
*Assistant Examiner* — Ankush Singal
(74) *Attorney, Agent, or Firm* — WPAT, P.C.; Anthony King

(57) ABSTRACT

A chip bump structure is formed on a substrate. The substrate includes at least one contact pad and a dielectric layer. The dielectric layer has at least one opening. The at least one opening exposes the at least one contact pad. The chip bump structure includes at least one elastic bump, at least one first metal layer, at least one second metal layer, and at least one solder ball. The at least one elastic bump covers a central portion of the at least one contact pad. The at least one first metal layer covers the at least one elastic bump. The at least one first metal layer has a portion of the at least one contact pad. The portion of the at least one contact pad is not overlaid by the at least one elastic bump. The at least one second metal layer is formed on a portion of the at least one first metal layer. The portion of the at least one first metal layer is located on the top of the at least one elastic bump. The at least one solder ball is formed on the at least one second metal layer. The at least one solder ball is also on the top of the at least one elastic bump.

12 Claims, 7 Drawing Sheets

U.S. PATENT DOCUMENTS

| | | | |
|---|---|---|---|
| 7,952,200 B2 * | 5/2011 | Meyer et al. | 257/773 |
| 7,960,272 B2 * | 6/2011 | Lee et al. | 438/613 |
| 7,977,788 B2 * | 7/2011 | Chang et al. | 257/737 |
| 2001/0040290 A1 * | 11/2001 | Sakurai et al. | 257/737 |
| 2002/0033531 A1 * | 3/2002 | Matsushima et al. | 257/734 |
| 2004/0048202 A1 * | 3/2004 | Lay et al. | 430/311 |
| 2005/0001316 A1 * | 1/2005 | Dean et al. | 257/750 |
| 2005/0062153 A1 * | 3/2005 | Saito et al. | 257/737 |
| 2005/0112800 A1 * | 5/2005 | Yamano | 438/113 |
| 2006/0065978 A1 * | 3/2006 | Nishiyama et al. | 257/737 |
| 2006/0219567 A1 * | 10/2006 | Hu | 205/125 |
| 2006/0244140 A1 * | 11/2006 | Hu | 257/737 |
| 2006/0252248 A1 * | 11/2006 | Hu | 438/613 |
| 2008/0054457 A1 * | 3/2008 | Lin et al. | 257/737 |
| 2008/0277785 A1 * | 11/2008 | Hwan et al. | 257/737 |
| 2010/0267204 A1 * | 10/2010 | Hwan et al. | 438/113 |

* cited by examiner

CHIP BUMP STRUCTURE AND METHOD FOR FORMING THE SAME

BACKGROUND OF THE INVENTION

1. Field of the Invention

The present invention relates to a chip bump structure and a method for forming the same.

2. Description of the Related Art

Flip-chip bonding technology is defined as the technique of directly connecting chips to substrates using bumps. Recently, the input/output terminals of such technology are getting smaller, resulting in densely concentrated pads on chips. Due to the dimension limitation of conventional bumps, bumps are not suitable for fine-pitch chips. Consequently, copper pillars have been introduced.

Copper pillars are formed using an electroplating process, obtained by depositing metal in via holes in a thick photoresist layer. However, a uniformly thick photoresist layer cannot be easily obtained, which means a uniform height of copper pillars cannot be easily achieved. Non-uniform heights of copper pillars may cause poor electrical connections between chips and a printed circuit board. Further, copper pillars are hard, and when the copper pillars having different heights are bonded, taller copper pillars may sustain greater stresses, causing a crack generation or peel-off issue. In addition, the formation of via holes on a thick photoresist layer requires high exposure energy. Such a photolithography process cannot be easily controlled. Furthermore, when via holes are formed by development, the formation of via holes may not be completed due to underdeveloped photoresist, adversely affecting the formation of copper pillars. Moreover, when the under bump metal layer is etched, the copper pillars may also be etched, rendering the dimensions of the copper pillars impossible to control.

In addition, copper pillars are easily oxidized, causing problems with electrical connection between chips and printed circuit boards.

In view of the issues related to the adoption of copper pillars as bump structures, a new bump structure is required as a replacement.

SUMMARY OF THE INVENTION

One objective of the present invention is to provide a chip bump structure and a method for forming the same. The chip bump structure is not easily oxidized, can provide a buffer effect and does not suffer the crack generation or peel-off issue when it is overstressed.

Another objective of the present invention is to disclose a chip bump structure, wherein the height and transverse dimension of the elastic bump can be easily controlled, and a method for forming the same.

In accordance with the above objectives, a first embodiment of the present invention discloses a chip bump structure formed on a substrate including at least one contact pad and a dielectric layer having at least one opening exposing the at least one contact pad. The chip bump structure comprises at least one elastic bump, at least one first metal layer, at least one second metal layer, and at least one solder ball. The at least one elastic bump correspondingly covers a central portion of the at least one contact pad. The at least one first metal layer correspondingly covers the at least one elastic bump and a portion of the at least one contact pad that is not overlaid by the at least one elastic bump. The at least one second metal layer is correspondingly formed on a portion of at least one first metal layer located on top of the at least one elastic bump. The at least one solder ball is correspondingly formed on the at least one second metal layer, on the top of the at least one elastic bump.

A second embodiment of the present invention discloses another chip bump structure formed on the above-mentioned substrate and comprising at least one elastic bump, at least one first metal layer, at least one second metal layer, and at least one solder ball. The at least one elastic bump is formed on the dielectric layer. The at least one first metal layer covers the at least one elastic bump and the at least one contact pad, extending between the at least one elastic bump and the at least one contact pad. The at least one second metal layer is formed on a portion of at least one first metal layer located on a top of the at least one elastic bump. The at least one solder ball is formed on the at least one second metal layer, on the top of the at least one elastic bump.

A first embodiment of the present invention discloses a method for forming the chip bump structure of the above-mentioned first embodiment comprising: providing a substrate including at least one contact pad and a dielectric layer having at least one opening exposing the at least one contact pad; forming at least one elastic bump in the at least one opening, wherein the at least one elastic bump partially covers a central portion of the at least one contact pad; disposing a first metal layer; electroplating a second metal layer on a portion of the first metal layer on a top of the at least one elastic bump; electroplating a solder material layer on the second metal layer; forming a patterned photoresist layer covering the solder material layer and portions of the first metal layer that are on the at least one elastic bump, in the at least one opening, and in a peripheral area surrounding the opening; etching portions of the first metal layer that are not overlaid by the patterned photoresist layer; removing the patterned photoresist layer; and reflowing the solder material layer to obtain a solder ball.

A second embodiment of the present invention discloses a method for forming the chip bump structure of the above-mentioned second embodiment comprising: providing a substrate including at least one contact pad and a dielectric layer having at least one opening exposing the at least one contact pad; forming at least one elastic bump on the dielectric layer; disposing a first metal layer; electroplating a second metal layer on a portion of the first metal layer on a top of the at least one elastic bump; electroplating a solder material layer on the second metal layer; forming a patterned photoresist layer covering the solder material layer and portions of the first metal layer that are on the at least one elastic bump and on the at least one contact pad, wherein the portion of the first metal layer extends between the at least one elastic bump and the at least one contact pad; etching portions of the first metal layer that are not overlaid by the patterned photoresist layer; removing the patterned photoresist layer; and reflowing the solder material layer to obtain a solder ball.

To better understand the above-described objectives, characteristics and advantages of the present invention, embodiments, with reference to the drawings, are provided for detailed explanations.

BRIEF DESCRIPTION OF THE DRAWINGS

The invention will be described according to the appended drawings in which.

DETAILED DESCRIPTION OF THE INVENTION

Figure 1:
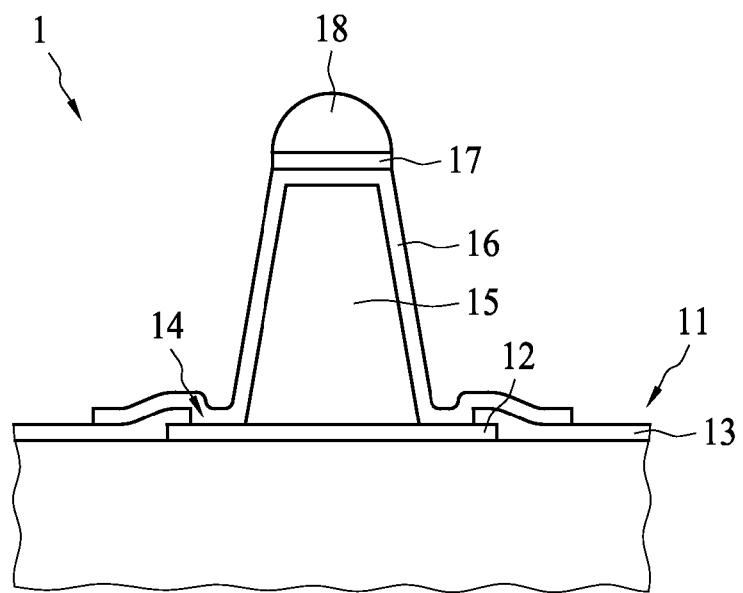
FIG. 1 is a view showing a chip bump structure according to one embodiment of the present invention.

FIG. 1 is a view showing a chip bump structure 1 according to one embodiment of the present invention. Referring to FIG. 1, the chip bump structure 1 can be formed on a substrate 11, which may comprise at least one contact pad 12 and a dielectric layer 13 including at least one opening 14 disposed in accordance with the at least one contact pad 12, wherein the at least one opening 14 exposes the at least one contact pad 12. The chip bump structure 1 may comprise at least one elastic bump 15, at least one first metal layer 16, at least one second metal layer 17, and at least one solder ball 18. The at least one elastic bump 15 is disposed in accordance with the at least one contact pad 12, covering a portion of the at least one contact pad 12. The at least one elastic bump 15 has a height preferably in a range of from 20 to 60 micrometers.

The at least one first metal layer 16 covers the corresponding elastic bump 15 and the portion of at least one contact pad 12 that is not overlaid by the at least one elastic bump 15. The at least one second metal layer 17 is disposed on the portion of the first metal layer 16 that is on the top of the corresponding elastic bump 15. The at least one solder ball 18 is formed on the corresponding second metal layer 17.

In particular, in the present embodiment, the elastic bump 15 is formed on a central portion of the corresponding contact pad 12, and the exposed portion of the contact pad 12 surrounds the bottom edge of the elastic bump 15. The dimensions of the elastic bump 15 and the corresponding contact pad 12 can be adjusted according to the requirement of the contact area between the first metal layer 16 and the exposed portion of the contact pad 12.

The first metal layer 16 can cover the entire corresponding elastic bump 15. The first metal layer 16 can further cover the portion of the corresponding contact pad 12 that is not overlaid by the at least one elastic bump 15, thereby establishing the electrical connection between the first metal layer 16 and the at least one contact pad 12. Preferably, the first metal layer 16 can be electroplated to a thickness in a range of from 0.2 micrometers to 0.6 micrometers.

The second metal layer 17 is formed on the portion of the first metal layer 16 located on the top of the corresponding elastic bump 15, thereby establishing the electrical connection between the second metal layer 17 and its corresponding contact pad 12. Preferably, the second metal layer 17 can be electroplated to a thickness in a range of from 3 micrometers to 10 micrometers.

At least one solder ball 18 is correspondingly formed on the second metal layer 17. The solder ball 18 can be of a thickness in a range of from 10 micrometers to 40 micrometers. The solder ball 18 allows the contact pad 12 to electrically connect to an external electronic device or a printed circuit board.

Compared with conventional copper pillars, the elastic bump 15 has elasticity so that it can absorb stress, avoiding damage caused by high stress. The solder ball 18 is on the top of the elastic bump 15, the center of the contact pad 12; consequently, excessive solder overflow issue can be avoided when the attachment to an external printed circuit board or chip is performed. Thus, the chip bump structure 1 is suitable for fine pitch chips.

Figure 2:
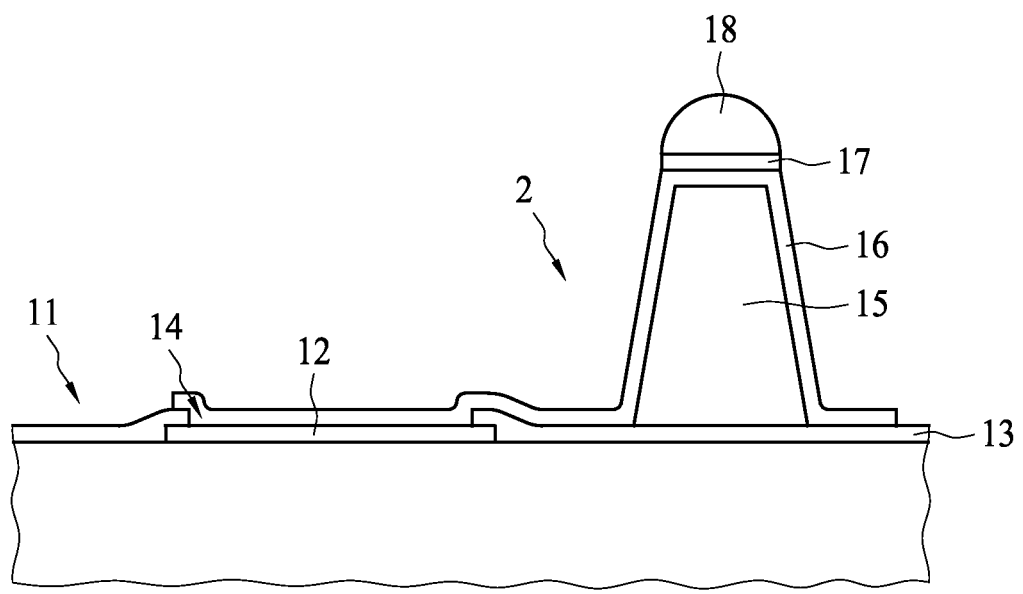
FIG. 2 is a view showing a chip bump structure according to another embodiment of the present invention.

FIG. 2 is a view showing a chip bump structure 2 according to another embodiment of the present invention. As shown in FIG. 2, the chip bump structure 2 is formed on a substrate 11 including at least one contact pad 12 and a dielectric layer 13 having at least one opening 14 disposed with respect to the at least one contact pad 12 and exposing the at least one contact pad 12. The chip bump structure 2 may include at least one elastic bump 15, at least one first metal layer 16, at least one second metal layer 17, and at least one solder ball 18. The at least one elastic bump 15 is formed on the dielectric layer 13, and is disposed in accordance with the at least one contact pad 12. The at least one first metal layer 16 corresponds to the at least one elastic bump 15, covering the at least one elastic bump 15 and the corresponding at least one contact pad 12, and extending between the at least one elastic bump 15 and the at least one contact pad 12. The at least one second metal layer 17 is formed on the portion of the at least one first metal layer 16 located on the top of the corresponding elastic bump 15. The at least one solder ball is formed on the corresponding second metal layer 17. With the above-mentioned arrangements, the solder ball 18 can electrically connect to the corresponding contact pad 12, through which a chip can electrically connect to an external device or a printed circuit board. Because the one elastic bump 15 is disposed on the dielectric layer 13, not directly on the contact pad 12, the dielectric layer 13 can provide another stress absorbing protection other than the elastic bump 15. Thus, the direct impact of bonding force is absorbed, and damage to the contact pad 12 can be avoided.

In the embodiments of the present invention, the elastic bump 15 can be a pillar tapered from its bottom to its top, such as a cone or pyramid. The top of the elastic bump 15 can be flat. The elastic bump 15 can be comprised of polymer such as polyimide, epoxy resin, or other similar dielectric material.

In the embodiments of the present invention, the first metal layer 16 can be comprised of a material selected from the group consisting of gold, titanium tungsten-god, titanium copper, and an alloy thereof. The thickness of the first metal layer 16 can be in a range of from 0.2 micrometers to 0.6 micrometers.

In the embodiments of the present invention, the second metal layer 17 is used as an interface layer between the first metal layer 16 and the solder ball 18. The second metal layer 17 includes a material that can be easily attached with solder material and prevents the diffusion of the solder material. For example, the second metal layer 17 can be, but is not limited to, nickel with a thickness of from 3 micrometers to 10 micrometers. The solder ball 18 can be comprised of tin, tin-lead alloy, or tin-silver alloy, locally disposed on the top of the second metal layer 17.

In the embodiments of the present invention, the substrate 11 can be comprised of silicon, glass, or plastics. The dielectric layer 13 can be comprised of, for example, silicon dioxide or nitride such as silicon nitride.

Figure 3:
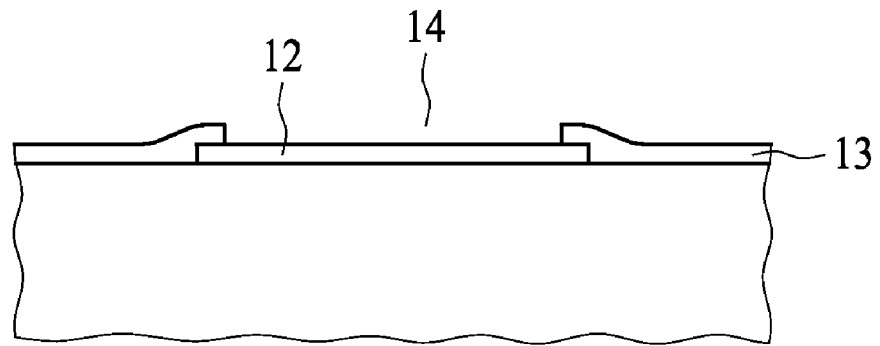
FIGS. 3 to 8 are sectional views showing process steps of a method for forming a chip structure according to one embodiment of the present invention.

FIGS. 3 to 8 are sectional views showing process steps of a method for forming a chip structure 1 according to one embodiment of the present invention. As shown in FIG. 3, the method for forming a chip structure 1 initially provides a substrate 11 including at least one contact pad 12 and a dielectric layer 13 having at least one opening 14 disposed with respect to the at least one contact pad 12 and exposing the at least one contact pad 12.

Figure 4:
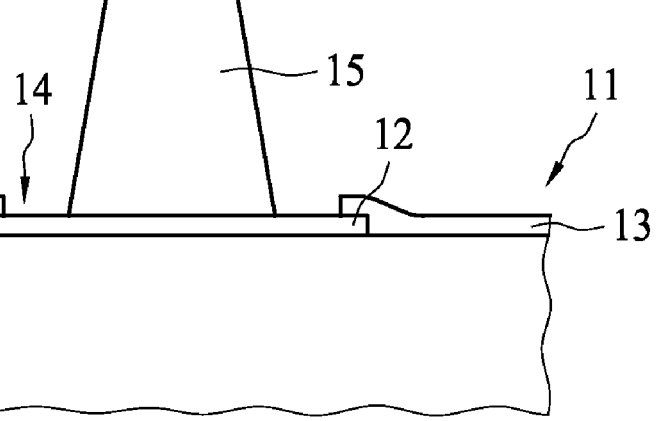

Referring to FIG. 4, a photoresist layer is then coated on the substrate 11, and an elastic bump 15 is formed in a respective opening 14 using a photolithographic process. The elastic bump 15 covers a portion of the at least one contact pad 12. In the present embodiment, the elastic bump 15 is formed on the central portion of the corresponding contact pad 12 such that the exposed portion of the contact pad 12 surrounds the bottom of the elastic bump 15.

Figure 5:
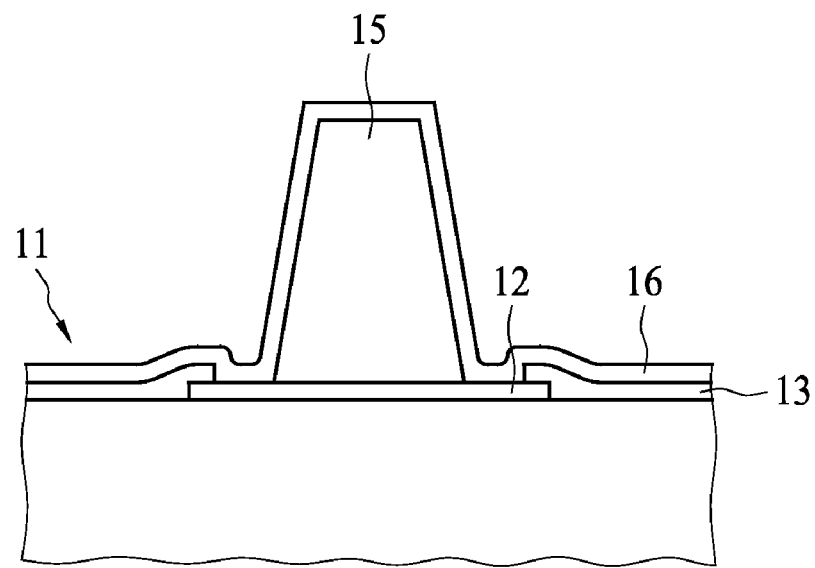

As shown in FIG. 5, a first metal layer 16 is deposited to cover the substrate 11 and the elastic bump 15, attaching to the portion of the contact pad 12 that is not overlaid by the elastic bump 15.

Figure 6:
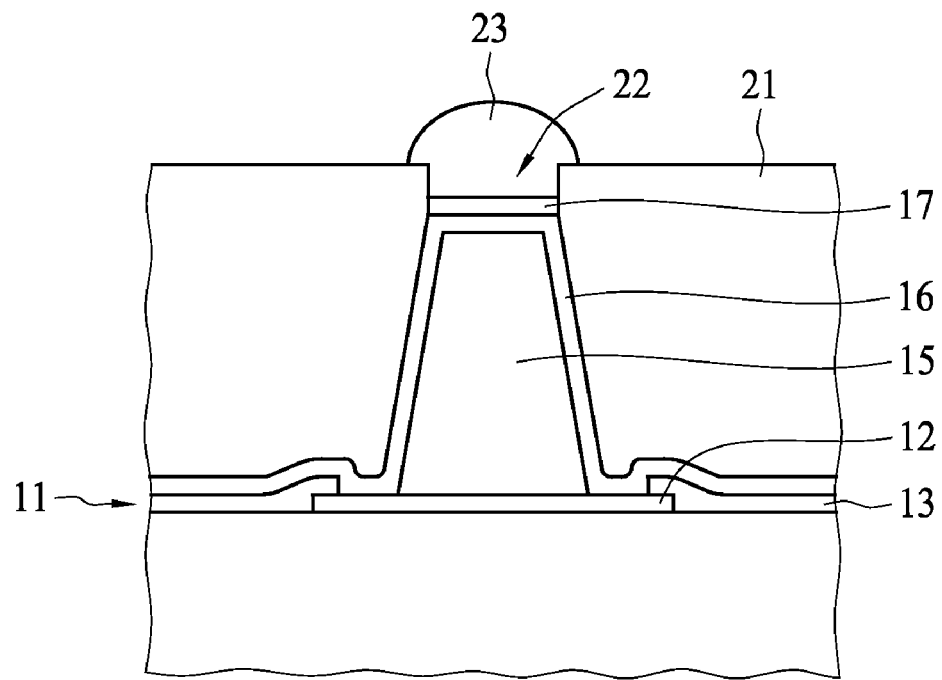

As shown in FIG. 6, a patterned photoresist layer 21 is formed on the first metal layer 16. The patterned photoresist layer 21 includes a plurality of holes 22 each corresponding to a respective elastic bump 15 and exposing the top of the respective elastic bump 15. Thereafter, a second metal layer 17 is electroplated on the first metal layer 16 in each opening 22. Next, a solder material layer 23 is electroplated on the second metal layer 17. Subsequently, the patterned photoresist layer 21 is removed.

Figure 7:
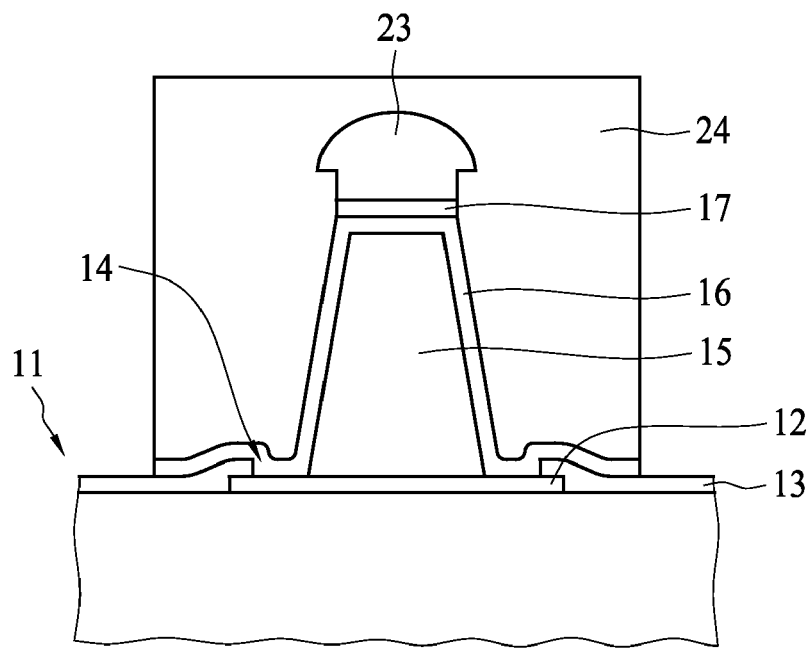

Referring to FIG. 7, a patterned photoresist layer 24 is formed, covering the solder material layer 23 and the portions of first metal layer 16 that are on the elastic bumps 15, in the openings 14, and in a peripheral area surrounding the openings 14. Next, the portions of the first metal layer 16 that are not covered by the patterned photoresist layer 24 are etched away such that the solder material layers 23 are electrically isolated from each other. After etching, the patterned photoresist layer 24 is removed.

Figure 8:
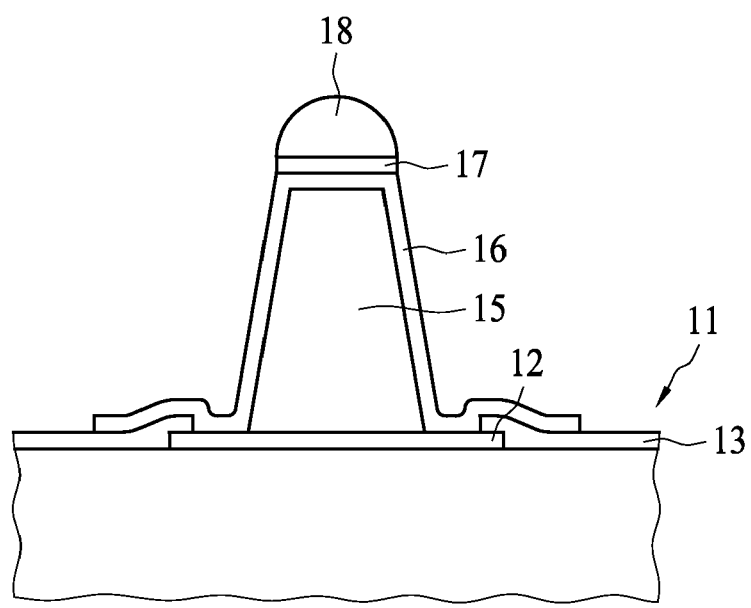

Referring to FIG. 8, a reflowing process is performed, turning the solder material layer 23 into a solder ball 18.

Figure 9:
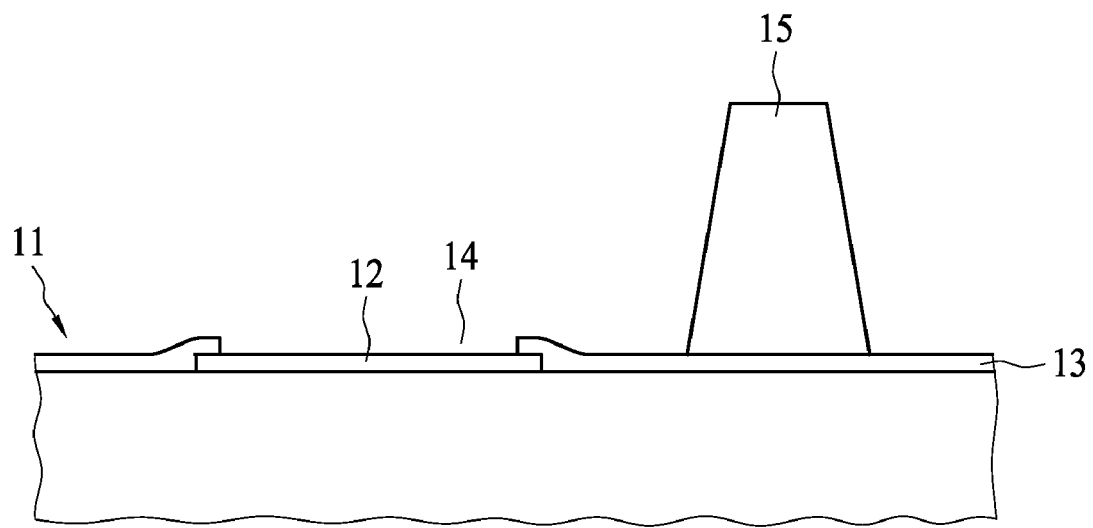
FIGS. 9 to 13 are sectional views showing process steps of a method for forming a chip structure of the embodiment of FIG. 2 according to one embodiment of the present invention.

FIGS. 9 to 13 are sectional views showing process steps of a method for forming a chip structure 2 of the embodiment of FIG. 2 according to one embodiment of the present invention. As shown in FIG. 9, the method for forming a chip structure 2 initially provides a substrate 11 including at least one contact pad 12 and a dielectric layer 13 having at least one opening 14 disposed with respect to the at least one contact pad 12 and exposing the at least one contact pad 12.

Referring to FIG. 9 again, a photoresist layer is formed on the substrate 11. A photolithographic process is employed to correspondingly form an elastic bump 15 on the dielectric layer 13 adjacent to a respective opening 14.

Figure 10:
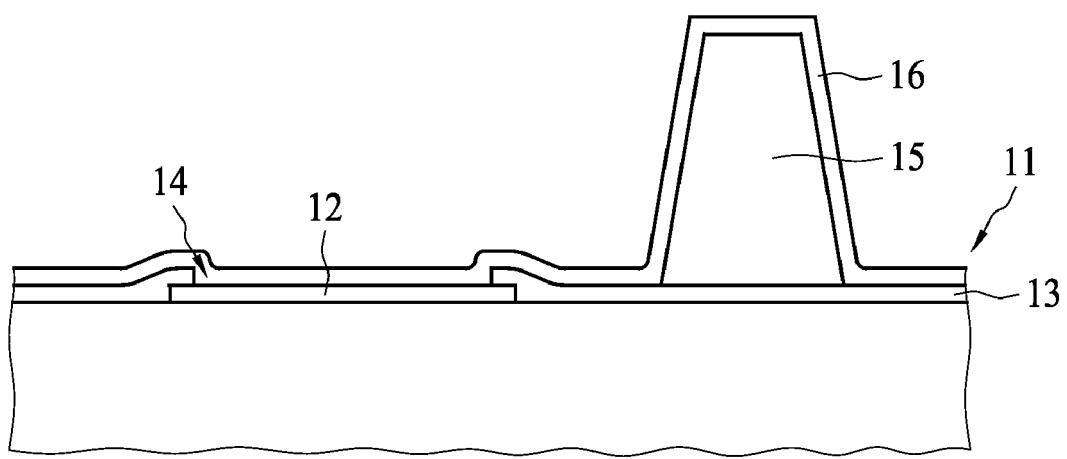

As shown in FIG. 10, a first metal layer 16 is deposited to cover the at least one elastic bump 15 and the at least one contact pad 12 in the corresponding opening 14 of the substrate 11 and the dielectric layer 13.

Figure 11:
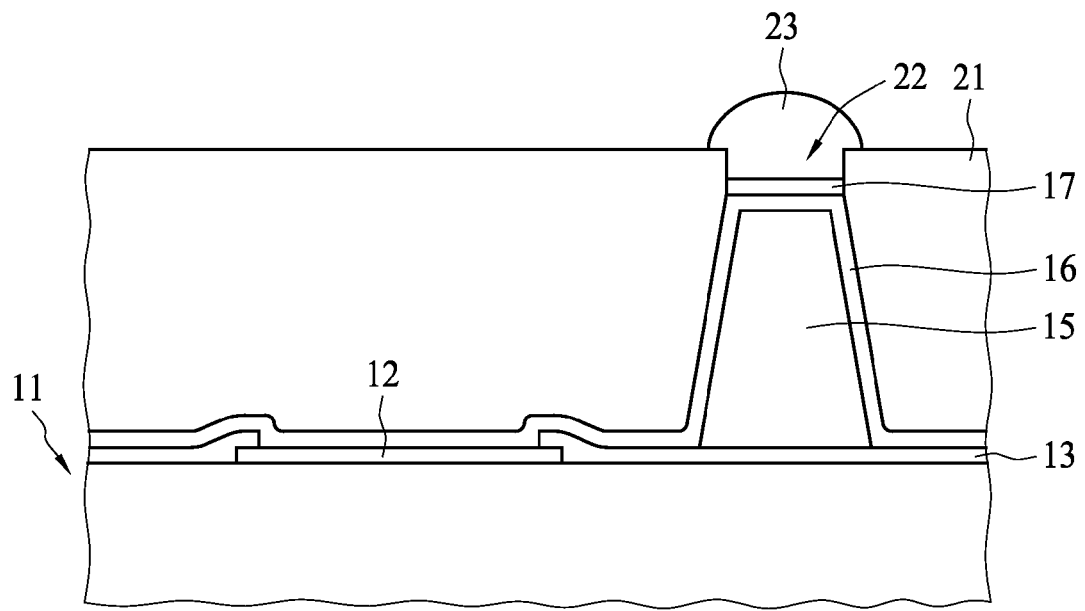

Referring to FIG. 11, a patterned photoresist layer 21 is formed on the first metal layer 16, including a plurality of openings 22 each corresponding to a respective elastic bump 15 and exposing the top of the corresponding elastic bump 15. A second metal layer 17 is then electroplated, formed on the first metal layer 16 in each opening 22. A solder material layer 23 is thereafter formed on each second metal layer 17, on the top of the elastic bump 15. The patterned photoresist layer 21 is finally removed.

Figure 12:
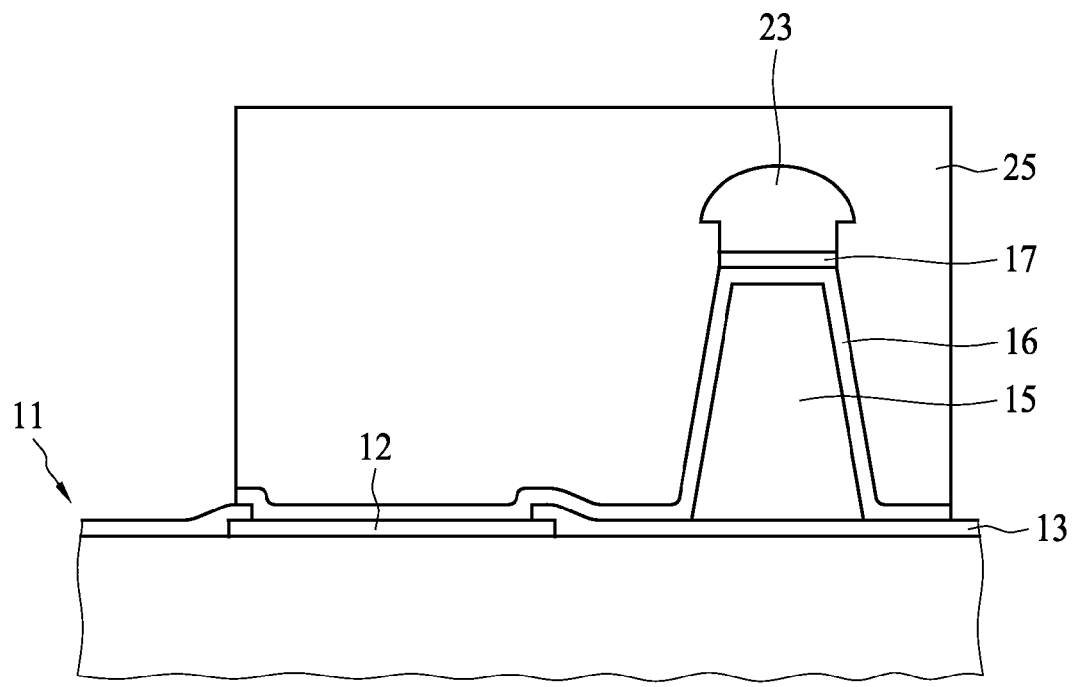

As shown in FIG. 12, a patterned photoresist layer 25 is formed, covering the solder material layer 23, the portion of the first metal layer 16 on the at least one elastic bump 15, the portion of the first metal layer 16 on the at least one contact pad 12, and the portion of the first metal layer 16 extending between the at least one contact pad 12 and the corresponding at least one elastic bump 15. The portions of the first metal layer 16 that are not covered by the patterned photoresist layer 25 are etched away. Consequently, the solder layer 23 and its corresponding contact pad 12 are electrically connected, and the solder layers 23 are electrically isolated from each other. After etching, the patterned photoresist layer 25 is removed.

Figure 13:
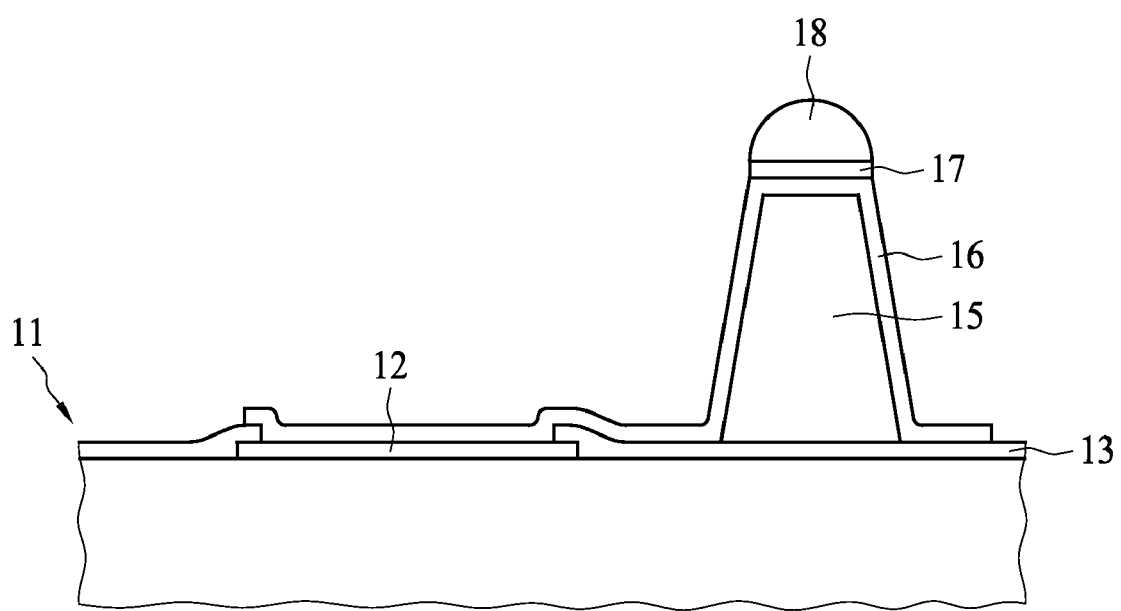

Referring to FIG. 13, a reflowing process is performed, turning the solder material layer 23 into a solder ball 18.

In comparison to the process for fabricating copper pillars, the process of the present invention does not include a step for forming deep via holes; thus the lithographic conditions in the process of the present invention can be tightly controlled, and the underdevelopment of photoresist will not occur.

In summary, compared with copper pillars, the present invention discloses an elastic bump, which will not be oxidized, and will not break or be forced apart. In addition, the height and the transverse dimension of the elastic bump can be easily controlled. The elastic bump can be formed on the central portion of a corresponding contact pad so that the elastic bumps can be densely arranged. Alternatively, the elastic bump can be formed next to a corresponding contact pad. The elastic bump can be overlaid with a first metal layer, which extends to an exposed portion of the contact pad. A solder ball can be formed on the top of an elastic bump, and a second metal layer used as an interface can be formed between the solder ball and the first metal layer.

The above-described embodiments of the present invention are intended to be illustrative only. Persons skilled in the art may devise numerous alternative embodiments without departing from the scope of the following claims.

What is claimed is:

1. A chip bump structure formed on a substrate including at least one contact pad and a dielectric layer having at least one opening, the at least one opening exposing the at least one contact pad, the chip bump structure comprising:
    at least one elastic bump covering both a central portion of the at least one contact pad;
    at least one first metal layer covering the at least one elastic bump and a portion of the at least one contact pad that is not overlaid by the at least one elastic bump;
    at least one second metal layer formed on a portion of the at least one first metal layer located on the top of the at least one elastic bump; and
    at least one solder ball formed on the at least one second metal layer and on the top of the at least one elastic bump.

2. The chip bump structure of claim 1, wherein the at least one elastic bump comprises one of polyimide and epoxy resin.

3. The chip bump structure of claim 1, wherein the at least one first metal layer comprises a material selected from the group consisting of gold, titanium tungsten-gold, titanium copper, and an alloy thereof.

4. The chip bump structure of claim 1, wherein the at least one second metal layer comprises nickel.

5. A chip bump structure formed on a substrate including at least one contact pad and a dielectric layer having at least one opening, the at least one opening exposing the at least one contact pad, the chip bump structure comprising:
    at least one elastic bump formed on the dielectric layer;
    at least one first metal layer covering both the at least one elastic bump and the at least one contact pad, and extending between the at least one elastic bump and the at least one contact pad;
    at least one second metal layer formed on a portion of the at least one first metal layer located on the top of the at least one elastic bump; and
    at least one solder ball formed on the at least one second metal layer and on the top of the at least one elastic bump.

6. A method for forming a chip bump structure, comprising the steps of:
    providing a substrate including at least one contact pad and a dielectric layer, the dielectric layer having at least one opening exposing the at least one contact pad;

forming at least one elastic bump in the at least one opening, wherein the at least one elastic bump covers a central portion of the at least one contact pad;
disposing a first metal layer on at least one elastic bump;
electroplating a second metal layer on a portion of the first metal layer on the top of the at least one elastic bump;
electroplating a solder material layer on the second metal layer;
forming a patterned photoresist layer covering the solder material layer, a portion of the first metal layer that is on the at least one elastic bump, a portion of the first metal layer that is in the at least one opening, and a portion of the first metal layer that is in a peripheral area surrounding the opening;
etching portions of the first metal layer that are not overlaid by the patterned photoresist layer;
removing the patterned photoresist layer; and
reflowing the solder material layer to obtain a solder ball.

7. The method of claim 6, wherein the step of disposing a second metal layer comprises the steps of:
coating a photoresist layer on the first metal layer; and
patterning the photoresist layer to remove a portion of the photoresist layer on the top of the at least one elastic bump.

8. The method of claim 6, wherein the at least one elastic bump comprises one of polyimide and epoxy resin.

9. The method of claim 6, wherein the first metal layer comprises a material selected from the group consisting of gold, titanium tungsten-gold, titanium copper, and an alloy thereof.

10. The method of claim 6, wherein the second metal layer comprises nickel.

11. A method for forming a chip bump structure, comprising the steps of:
providing a substrate including at least one contact pad and a dielectric layer, the dielectric layer having at least one opening exposing the at least one contact pad;
forming at least one elastic bump on the dielectric layer;
disposing a first metal layer on at least one elastic bump;
electroplating a second metal layer on a portion of the first metal layer on the top of the at least one elastic bump;
electroplating a solder material layer on the second metal layer;
forming a patterned photoresist layer covering the solder material layer, a portion of the first metal layer that is on the at least one elastic bump, a portion of the first metal layer that is on the at least one contact pad, and a portion of the first metal layer that extends between the at least one elastic bump and the at least one contact pad;
etching portions of the first metal layer that are not overlaid by the patterned photoresist layer;
removing the patterned photoresist layer; and
reflowing the solder material layer to obtain a solder ball.

12. The method of claim 11, wherein the step of disposing a second metal layer comprises the steps of:
coating a photoresist layer on the first metal layer; and
patterning the photoresist layer to remove a portion of the photoresist layer on the top of the at least one elastic bump.

* * * * *